United States Patent [19]

Kosaka et al.

[11] Patent Number: 4,587,376
[45] Date of Patent: May 6, 1986

[54] SUNLIGHT-INTO-ENERGY CONVERSION APPARATUS

[75] Inventors: Haruhisa Kosaka, Nara; Daizo Takaoka, Takatsuki, both of Japan

[73] Assignee: Sanyo Electric Co., Ltd., Japan

[21] Appl. No.: 647,989

[22] Filed: Sep. 6, 1984

[30] Foreign Application Priority Data

Sep. 13, 1983 [JP] Japan .............................. 58-170488
Dec. 20, 1983 [JP] Japan .............................. 58-241486

[51] Int. Cl.⁴ .......................... H01L 31/04; F24J 2/42
[52] U.S. Cl. ................................. 136/248; 136/257; 136/258
[58] Field of Search ........ 136/248, 257, 259, 258 AM

[56] References Cited

U.S. PATENT DOCUMENTS

Re. 29,833 11/1978 Mlavsky .............................. 136/246
4,278,829 7/1981 Powell ................................ 136/248

FOREIGN PATENT DOCUMENTS 57-26478 2/1982 Japan .................................. 136/248
58-62455 4/1983 Japan .................................. 136/248
58-135684 8/1983 Japan .................................. 136/248

*Primary Examiner*—Aaron Weisstuch
*Attorney, Agent, or Firm*—Darby & Darby

[57] ABSTRACT

An apparatus in which amorphous silicon solar cells are formed on a heat collecting plate. The solar cells are formed by using a superstrate or a substrate. Both a light-permeable superstrate and a metallic substrate are available for use. If the light-permeable superstrate is adopted, metallic electrodes, formed on the side of the heat collecting plate as lower electrodes of the solar cells, are attached to the heat collecting plate through electrically insulating adhesives, provided that the upper surface of the superstrate is exposed against the incident sunlight. The light-permeable superstrate is made of a heat absorbing material transmitting light having a wavelength range which is absorbed by the amorphous silicon layer of the solar cells while absorbing light having a wavelength range which is transmitted through the amorphous silicon layer thereby to convert the light into thermal energy. Alternatively, a heat absorbing layer made of a material having the above-mentioned property may be provided on a transparent superstrate. On the other hand, if the metallic substrate is used, the substrate is also available for the heat collecting plate, or is attached to the heat collecting plate while said heat absorbing layer may be provided on transparent electrodes formed on the upper side of the substrate as upper electrodes of the solar cells.

10 Claims, 12 Drawing Figures

SUNLIGHT-INTO-ENERGY CONVERSION APPARATUS

FIELD OF THE INVENTION

The present invention relates to a sunlight-into-energy conversion apparatus and more specifically to a hybrid type sunlight-into-energy conversion apparatus (hereinafter abbreviated as "hybrid collector") in which a main portion comprising amorphous silicon (hereinafter abbreviated as a-Si) solar cells attached to a heat collecting plate at their lower sides is enclosed in a vacuum vessel or a vessel filled with dry air or inert gas, whereby the simultaneous collection of thermal and electrical energies from the incident sunlight is made possible.

BACKGROUND OF THE INVENTION

An embodiment of the hybrid collector is disclosed in the U.S. Pat. No. 4,334,120 assigned to the assignee of the present invention. In this embodiment, the hybrid collector comprises a main portion, enclosed in a vacuum vessel exhausted to obtain a substantial adiathermancy, including solar cells attached, directly or through an insulating film, to a heat collecting plate having a heat collecting tube.

Each of the above-mentioned solar cells comprises a metallic lower electrode, an a-Si layer and a transparent upper electrode successively formed in strata. Due to such construction, the light which is absorbed by the a-Si layer of the solar cell is converted into thermal and electrical energies. Furthermore, the thermal energy is outputted from the heat collecting plate through the heat collecting tube. Also, the electric energy is outputted through the electrodes.

Meanwhile, radiation spectra of sunlight is generally distributed over a wavelength range of about 0.3 $\mu$m to 2.5 $\mu$m and have a peak near the wavelength of 0.5 $\mu$m. On the other hand, it is known that the a-Si layer absorbs a considerable part of the light having wavelengths of less than about 0.8 $\mu$m while it scarcely absorbs light having wavelengths longer than 0.8 $\mu$m.

Accordingly, by means of the hybrid collector such as disclosed in the above-mentioned embodiment, a part of the incident sunlight, being transmitted into the hybrid collector through a transparent wall, usually formed of a glass, of a vessel enclosing the hybrid collector and having wavelengths of less than 0.8 $\mu$m, is effectively absorbed by the a-Si layer whereby it is converted into usable electric and thermal energies. However, light having wavelengths of about 0.8 $\mu$m 2.5 $\mu$m which may be transmitted, as mentioned above, through the a-Si layer is reflected by the lower electrode and radiated outward so that it is hardly utilized.

BRIEF SUMMARY OF THE INVENTIONS

One solution of this difficulty is to provide a heat absorbing layer on the surface of the solar cell so that the heat absorbing layer absorbs only the components of the sunlight within the wavelength range which is unabsorbed by the a-Si layer.

Such an improvement enables one to effectively utilize the components of the sunlight within the wavelength range being heretofore usuable.

Although the solar cell in the above-mentioned embodiment is formed on a metallic substrate, other materials such as glass and synthetic resin may also be used for the substrate.

Thus, according to the present invention, if a light-permeable material other than metals is used to form the substrate, the light-permeable material must have the same properties as that of the above-mentioned heat absorbing layer. Furthermore, the hybrid collector is constructed such that the solar cells formed on the lower side of the superstrate are attached to a heat collecting plate, provided the upper surface of the superstrate is exposed to the incident sunlight. If a material such as ordinary glass permitting all wavelengths of sunlight to be transmitted is used for the light-permeable superstrate, the hybrid collector is constructed in the same manner as described above except for the additional provision of the above-mentioned heat absorbing layer on the upper surface of the superstrate. Alternatively, if a metallic substrate is used, the hybrid collector is constructed by providing the heat absorbing layer on the upper surfaces of the solar cells.

Due to such constructions of the hybrid collector as described above, the wavelength range of sunlight which has not been absorbed heretofore may effectively be absorbed and utilized as thermal energy. Furthermore, adjacent to the a-Si layer, there is formed a metallic layer for the lower electrode on the side of the heat collecting plate. Thus, a part of the incident sunlight which is passed through and not absorbed in the a-Si layer is reflected back into the a-Si layer again by the metallic layer. Consequently, said part of the sunlight is passed two times across the a-Si layer whereby the efficiency of the conversion into electric energy may be increased.

It is the object of the present invention to improve the known hybrid collector so that all the wavelengths of sunlight may effectively be utilized, whereby the utilization efficiency of the sunlight may be increased.

BRIEF DESCRIPTION OF THE DRAWINGS

The invention will further be described by way of example, with reference to the accompanying drawings, in which.

DETAILED DESCRIPTION OF THE PREFERRED EMBODIMENT

Figure 1:
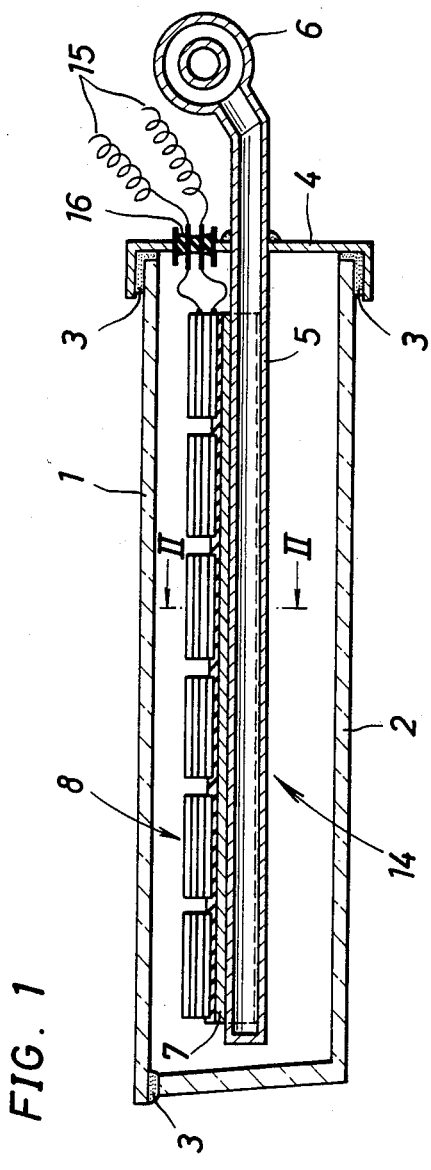
FIG. 1 is a schematic cross sectional view showing a preferred embodiment of a hybrid collector of the present invention.

As shown in an embodiment of FIG. 1, a hermetically sealed vessel of a flat rectangular parallelepiped shape is assembled by sealing together a transparent glass plate 1 and a formed glass bottom member 2 through frit 3, enclosing the right side opening with a metallic end plate 4 and sealing the portion of a heat pipe 5 passing through the metallic end plate 4 by welding. Said transparent plate 1 is formed of a material such as glass or synthetic resin through which almost the full wavelength range of sunlight is transmitted.

Figure 2:
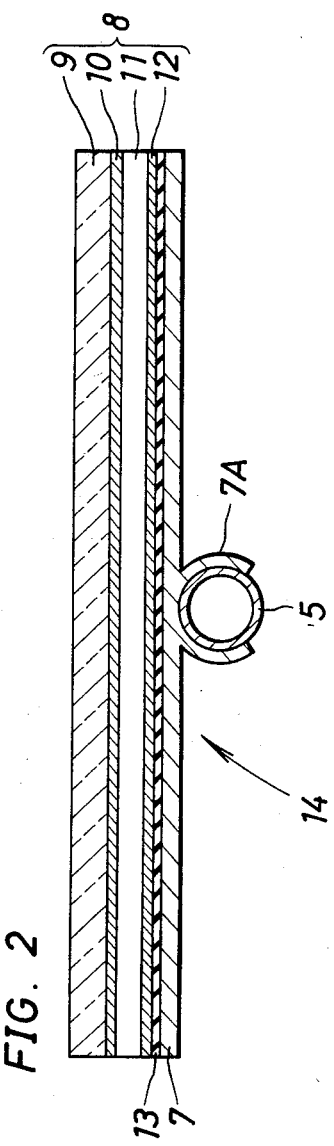
FIG. 2 is a schematic cross sectional view taken on line II—II of FIG. 1, the vessel and other parts being broken away, FIG. 3A–FIG. 3D diagrammatically illustrate transmittance characteristics of various glasses used for the light-permeable superstrate of the hybrid collector of FIG. 1, FIG. 4 diagramatically illustrates a light absorption characteristic of the light-permeable superstrate of the hybrid collector of FIG. 1, and FIG. 5–FIG. 9 are schematic cross sectional views, similar to FIG. 2, showing various modifications of the hybrid collector of the present invention.

The main portion of the hybrid collector is enclosed in said vessel. Furthermore, the vessel is filled with dry air or an inert gas such as nitrogen or argon gas to prevent the deterioration of solar cells due to moisture. The heat pipe 5 is connected at an open end thereof to a heat exchanger 6 while the opposite end portion extending into the vessel is engaged to a heat collecting plate 7. As shown in FIG. 2, the heat collecting plate 7 is secured on the heat pipe 5 by fitting onto the heat pipe a cross sectionally broken shaped cylindrical member 7A protruding from the heat collecting plate. Alternatively, the cylindrical member 7A may be formed in a full cylindrical shape while the heat pipe 5 may be inserted into the cylindrical member, so that various modifications may be made. Said heat collecting plate 7 may be made of an effective heat conducting metal such as copper, iron, aluminum. Onto the upper surface of the heat collecting plate, a-Si solar cells 8 are attached. Each a-Si solar cell 8 comprises a light-permeable superstrate 9 formed by a material such as glass or resin, an upper electrode 10, an a-Si layer 11, and a lower electrode 12.

A plurality of solar cells 8 are securely attached to the heating collecting plate 7 through insulating layers 13. Of course, these solar cells 8 are electrically connected to each other. For example, each solar cell 8 may be formed such that it has an area of 10 cm square, an output voltage of about 5 to 6 V and an output current of about 100 mA so that a plurality of such cells are connected in parallel as well as in series, corresponding to load requirements.

Figure 3A:
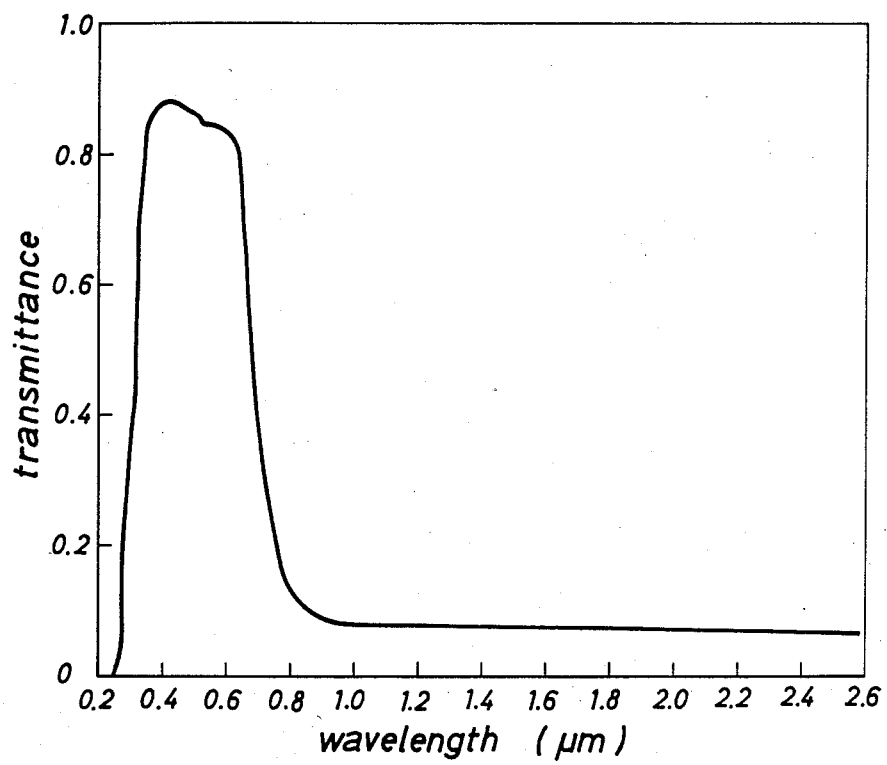
Figure 3B:
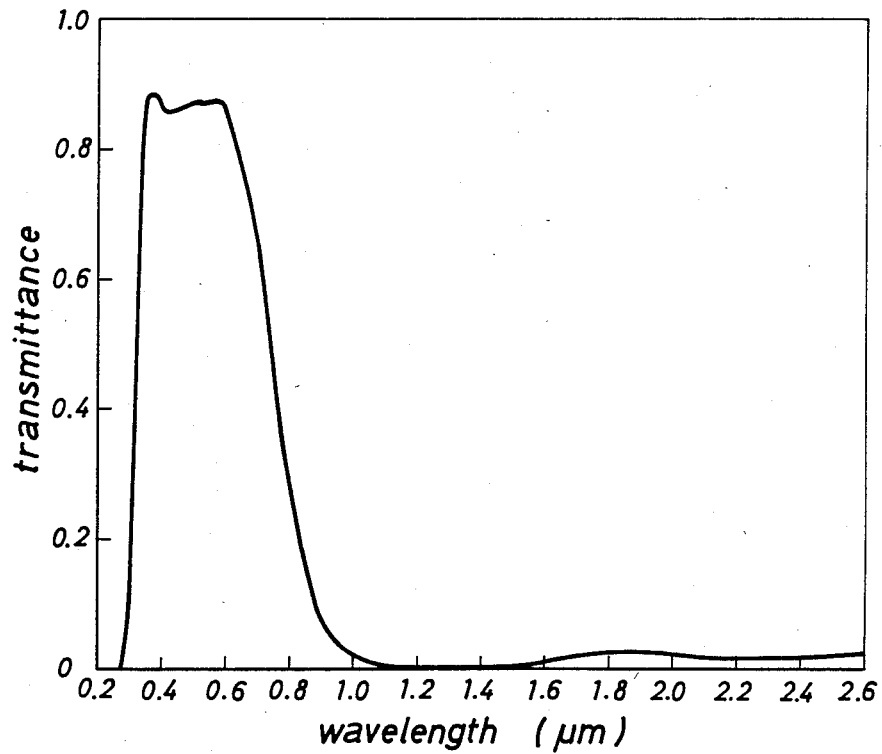
Figure 3C:
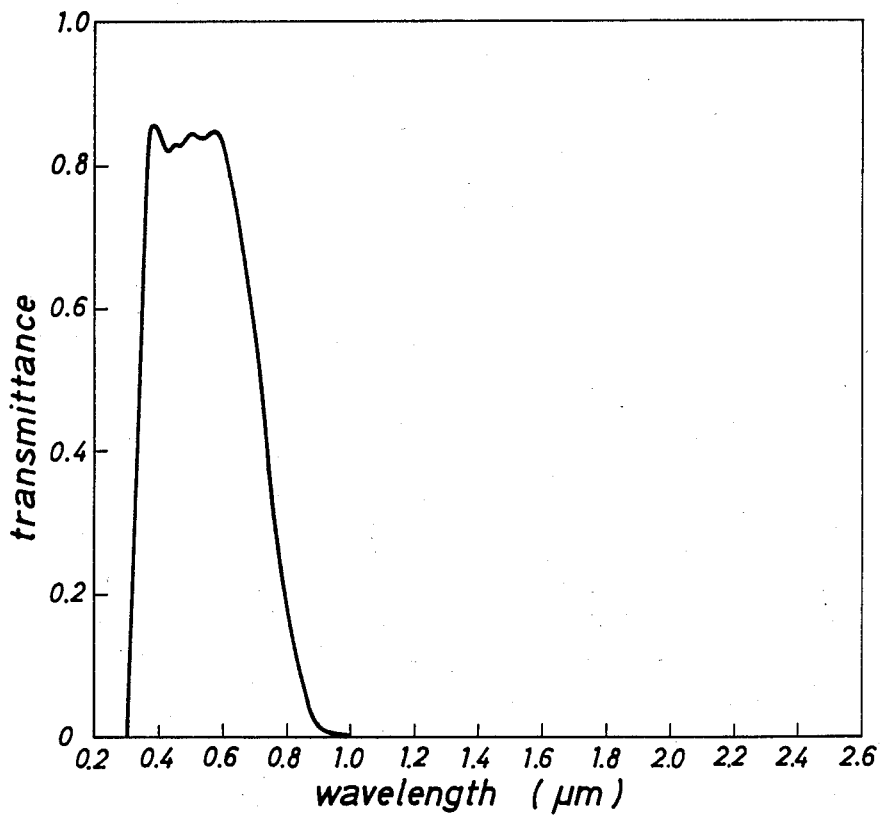
Figure 3D:
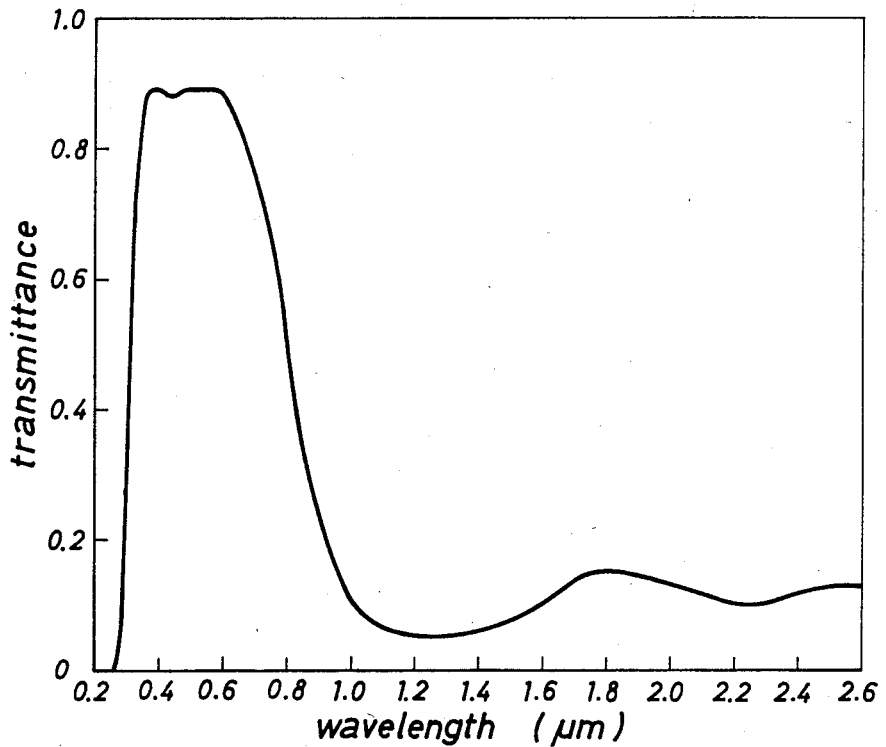

A material such as phosphate glass containing FeO or borophosphate that has an optical characteristic of transmitting light wave lengths of less than 0.8 $\mu$m while absorbing wave lengths of more than about 0.8 $\mu$m as shown in FIG. 3A (HA-50 supplied by Hoya Corporation) may be used for said light-permeable superstrate 9. Furthermore, phosphate glasses such as ISK-150, ISK-157 and ISK-370 supplied by Isuzu Seiko Glass Co., Ltd. having the optical characteristics shown respectively FIGS. 3B, 3C, and 3D are also available. Because the cost of solar cells is much greater than that of the heat collecting plate at the present time, it is desirable to form the light-permeable superstrate 9 of a material having optical characteristics wherein the transmittance in the wavelength range less than 0.8 $\mu$m is greater than 0.8. Alternatively, a light-permeable synthetic resin (for example, such as polymethacrylic resin, polystyrene resin, or polyfluoroethylene resin) containing a selected additive absorbent may also be used for the light-permeable superstrate. An infrared ray absorbent or near infrared ray absorbent being at least capable of absorbing wavelengths greater than 0.8 $\mu$m, such as triarylammonium salt or tetraaryl quinondiimonium salt may be used for the absorbent. The upper electrode 10 may be made of a transparent material such $SnO_2$ and $IN_2O_3$. Furthermore, the lower electrode 12 may be made of a metal such as Al, Ag, Au, and Ni.

A description will now be given of how to manufacture a-Si solar cells 8.

A transparent upper electrode 10 of a material such as $SnO_2$ is formed on one side of a glass like light-permeable superstrate 9 having a thickness of 3 mm. An a-Si layer 11 is then formed on the upper electrode 10 in an evacuated plasma reaction vessel in such a manner that a P type a-Si layer 100 Å in thickness, an I type a-Si layer 5000 Å in thickness, and an n type a-Si layer 500 Å in thickness are successively grown on the upper electrode by plasma discharge. A lower electrode 12 is then formed on the a-Si layer by vapor deposition of aluminum. Of course, the thickness of the solar cell 8 is not limited to that of the embodiment.

The a-Si solar cells 8 manufactured as mentioned above are then secured through an insulating adhesive layer 13 to said heat collecting plate 7 whereby a main portion 14 of the hybrid collector is constructed.

Although in the illustrative embodiment shown in FIG. 1, there is provided only one main portion in the vessel, a plurality of such main portions may also be provided in the vessel according to need.

A description will now be given of how to output heat and electricity from the hybrid collector.

Electric power generated by the absorption of sunlight in the a-Si layer 11 may be outputted from the upper electrode 10 and the lower electrode 12 by means of two lead wires 15 through a hermetic seal 16 attached to metallic end plate 4. On the other hand, heat absorbed by the a-Si layer 11 is collected by the heat collecting plate 7 and outputted to heat exchanger 6 mounted outside the vessel via heat pipe 5.

Figure 4:
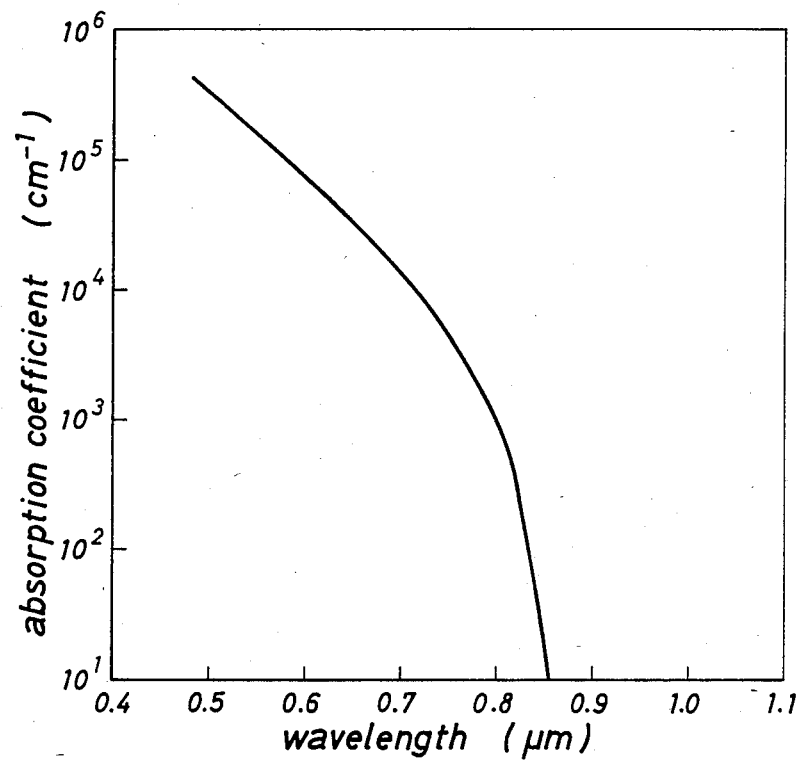

In a hybrid collector of the present invention, the light-permeable superstrate 9 may be formed of material that has an optical characteristic as shown in FIG. 4, transmitting wavelengths less than about 0.8 $\mu$m of light while absorbing wavelengths more than about 0.8 $\mu$m. Consequently, the wavelength range of sunlight of about 0.8 $\mu$m–2.5 $\mu$m which has not heretofore been utilized may be absorbed in the light-permeable superstrate 9 where it is converted into heat and conducted to the heat collecting plate 7 for effective utilization thereof. As a result, the efficiency of energy conversion of the hybrid collector may be improved.

Some tests have been made for the comparison of an apparatus according to the present embodiment with a conventional apparatus without the absorbing member under the conditions that the quantity of solar radiation, the atmospheric temperature, and the heat collecting temperature have been kept equal. In an example of such tests, as shown in the following Table 1, the quantity of heat collection is increased for the invention apparatus so that the heat collecting efficiency is improved by about 30%.

TABLE 1

|  | Inventive Apparatus | Conventional Apparatus |
| --- | --- | --- |
| quantity of solar radiation | 700 (Kcal/h) | 700 (Kcal/h) |
| atmospheric temperature | 25 (°C.) | 25 (°C.) |
| heat collecting temperature | 60 (°C.) | 60 (°C.) |
| heat collecting efficiency | 46 (%) | 17 (%) |

Furthermore, in the hybrid collector of the present invention, the lower electrode 12 made of a metallic material such as Al is formed just adjacent the a-Si layer. Thus, a part of the sunlight which is passed through and not absorbed in the a-Si layer may be reflected back into the a-Si layer again by the lower electrode 12. Consequently, said part of the sunlight may be passed two times across the a-Si layer, whereby the efficiency of the conversion to electric energy may be increased.

In this embodiment, the superstrate of the solar cell is also effective as a heat absorbing member so that the construction is simplified whereby the manufacturing process may be considerably facilitated.

Thus, the above-mentioned hybrid collector may be used to effectively convert sunlight into thermal and electric energies so that the full wavelength region of the sunlight may be effectively utilized.

Figure 5:
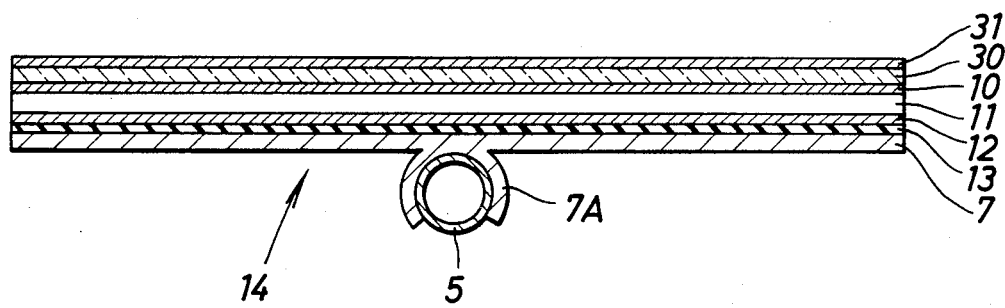

The invention will now further be described with reference to FIG. 5 showing a modified embodiment, in which like elements shown in FIG. 2 are given like reference characters. The construction shown in FIG. 5 is different from that shown in FIGS. 1 and 2 in that an ordinary glass superstrate 30 transmitting all the wavelengths of sunlight is adopted as a light-permeable superstrate 30 while a heat absorbing layer 31 is formed on the upper surface of the glass substrate 30.

The heat absorbing layer 31 may be formed in various manners such as by attaching a heat absorbing resin film on the upper surface of the glass superstrate 30 through a transparent adhesive, coating the upper surface of the glass superstrate 30 with a heat absorbing resin, attaching a heat absorbing glass plate on the upper surface of the glass superstrate 30 through a transparent adhesive or vapor depositing the upper surface of the glass superstrate 30 with a heat absorbing material.

Here, phosphate glass or borophosphate glass may be used for the heat absorbing glass. Also, a transparent organic resin such as polycarbonate, vinyl chloride, or acrylic impregnated with an organic absorbent for thermal rays may be usable for the heat absorbing resin.

By the construction of the hybrid collector such as described above, light having wavelengths longer than about 0.8 μm that may not be absorbed by the a-Si layer 11 may be absorbed and converted into thermal energy in the heat absorbing layer 31 so that the light energy contained within the full wavelength range of the sunlight may be converted to thermal and electric energies whereby a rather inexpensive means having an increased efficiency for the energy conversion may be provided, as in the case of the preceding embodiment.

Since the other advantages are the same as in the case of the preceding embodiment, description thereof may be omitted.

Figure 6:
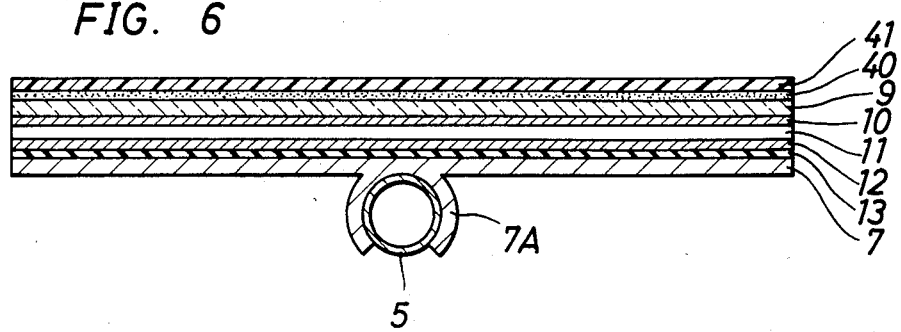

Referring now to FIG. 6 there is schematically shown another modified embodiment of the present invention, in which like elements as shown in FIG. 2 are given like reference characters. The construction shown in FIG. 6 is different from that shown in FIG. 2 in that a transparent fluorocarbon polymer film 41 having a refractive index of 1.34 is attached to a light-permeable superstrate 9 formed by a thermal ray absorbing glass such as phosphate glass having a refractive index of 1.51 through a transparent silicone adhesive 40 having a refractive index of 1.41 so that the refractive indices are gradually increased from the uppermost layer of a gas (which is assumed to be dry air having a refractive index of 1.0, in the present case) to the light-permeable superstrate 9.

By such a construction of the hybrid collector, reflection of sunlight incident the hybrid collector may be suppressed so that the utilization efficiency of the sunlight may be increased as will be described hereinafter.

The reflectance R of light at an interface of two media having respective refractive indices $n_1$ and $n_2$ may be expressed by the following formula:

$$R = (n_1 - n_2)^2/(n_1 + n_2)^2 \quad (1)$$

As will readily be understood from the formula, adjacent materials should be chosen so as to be as close as possible with respect to refractive index to keep the reflectance R small.

The value of the reflectance R for the case of FIG. 2 in which the transparent silicon adhesive 40 and the film 41 are absent may be determined as follows. If phosphate glass is used for the thermal ray absorbing material, since the refractive index $n_1$ of the uppermost layer which is air is 1.0 and the refractive index $n_2$ of the light-permeable substrate 9 is 1.51, the reflectance $R_1$ is 0.041.

On the other hand, for the case of FIG. 6 in which the film 41 is attached through the transparent silicone adhesive 40, the refractive index $n_3$ of the film is 1.34 and the refractive index $n_4$ of the transparent silicone adhesive 40 is 1.41.

Thus, the reflectance $r_1$ at the interface between the uppermost air layer and film 41 is:

$$\begin{aligned} r_1 &= (1 - n_3)^2/(1 + n_3)^2 \\ &= (1 - 1.34)^2/(1 + 1.34)^2 \\ &= 0.021, \end{aligned}$$

the reflectance $r_2$ at the interface between the film 41 and the transparent silicone adhesive 40 is:

$$\begin{aligned} r_2 &= (n_3 - n_4)^2/(n_3 + n_4)^2 \\ &= (1.34 - 1.41)^2/(1.34 + 1.41)^2 \\ &= 6.5 \times 10^{-4} \end{aligned}$$

and the reflectance $r_3$ at the interface between the transparent silicone adhesive 40 and the light-permeable substrate 9 is:

$$\begin{aligned} r_3 &= (n_4 - n_2)^2/(n_4 + n_2)^2 \\ &= (1.41 - 1.51)^2/(1.41 + 1.51)^2 \\ &= 1.2 \times 10^{-3}. \end{aligned}$$

Consequently, the total reflectance $R_2$ is:

$$\begin{aligned} R_2 &= r_1 + (1 - r_1) \times r_2 + [1 - (1 - r_1) \times r_2] \times r_3 \\ &= 0.021 + (1 - 0.021) \times 6.5 \times 10^{-4} + \\ &\quad [1 - (1 - 0.021) \times 6.5 \times 10^{-4}] \times 1.2 \times 10^{-3} \\ &= 0.021 + 6.4 \times 10^{-4} + 1.2 \times 10^{-3} \\ &= 0.023. \end{aligned}$$

Thus, it will be understood that the reflectance $R_2$ at the main portion of the hybrid collector is reduced to about one-half of that of the embodiment shown in FIG. 2, wherein the transparent slicone adhesive 40 and the film 41 are absent, so that the reflection of sunlight may be suppressed whereby the utilization efficiency of sunlight may be improved.

Other functions and effects are the same as in the case of FIG. 2.

Figure 7:
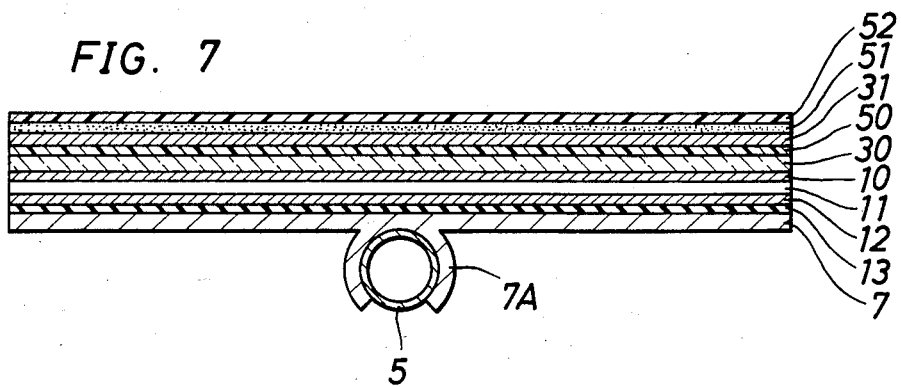

Referring now to FIG. 7, there is shown a further modified embodiment of the present invention equipped with a reflection preventing layer in addition to the main portion of the hybrid collector shown in FIG. 5, in which like elements as shown in FIG. 5 are given like reference characters. The construction shown in FIG. 7 is different from that shown in FIG. 5 in that the heat absorbing layer 31 is attached to the glass superstrate 30 through the intermediary of a transparent silicone resin layer 50 and a transparent boron containing resin film 52 is attached to the heat absorbing layer 31 through the intermediary of a transparent silicone adhesive layer 51.

As will now be described, by the construction of the hybrid collector such as mentioned above, the utilization efficiency of sunlight may also be increased in comparison with the case of FIG. 5.

(I) If the heat absorbing layer is formed by the use of phosphate glass, by taking the refractive indices $n_1$, $n_2$, $n_3$, $n_4$, $n_5$, and $n_6$ of the uppermost gas, the transparent boron resin film 52, the transparent silicone adhesive layer 51, the heat absorbing layer 31, the transparent silicone resin layer 50, and the glass superstrate 30, respectively, as $n_1 = 1.0$, $n_2 = 1.34$, $n_3 = 1.41$, $n_4 = 1.51$, $n_5 = 1.41$, and $n_6 = 1.51$, the reflectance $r_1$ at the interface between the uppermost gas and the transparent boron containing resin film 52 is:

$$r_1 = (n_1 - n_2)^2/(n_1 + n_2)^2$$
$$= (1 - 1.34)^2/(1 + 1.34)^2$$
$$= 0.021,$$

the reflectance $r_2$ at the interface between the transparent boron containing resin film 52 and the transparent silicone adhesive layer 51 is:

$$r_2 = (n_2 - n_3)^2/(n_2 + n_3)^2$$
$$= (1.34 - 1.41)^2/(1.34 + 1.41)^2$$
$$= 6.5 \times 10^{-4},$$

the reflectance $r_3$ at the interface between the transparent silicone adhesive layer 51 and the heat absorbing layer 31 is:

$$r_3 = (n_3 - n_4)^2/(n_3 + n_4)^2$$
$$= (1.41 - 1.51)^2/(1.41 + 1.51)^2$$
$$= 1.2 \times 10^{-3},$$

the reflectance $r_4$ at the interface between the heat absorbing layer 31 and the transparent silicone resin layer 50 is:

$$r_4 = (n_4 - n_5)^2/(n_4 + n_5)^2$$
$$= (1.51 - 1.41)^2/(1.51 + 1.41)^2$$
$$= 1.2 \times 10^{-3}$$

and the reflectance $r_5$ at the interface between the transparent silicone resin layer 50 and the glass superstrate 30 is:

$$r_5 = (n_5 - n_6)^2/(n_5 + n_6)^2$$
$$= (1.41 - 1.51)^2/(1.41 + 1.51)^2$$
$$= 1.2 \times 10^{-3}.$$

Thus, the total reflectance R from the uppermost surface of the main portion to the upper surface of the glass superstrate 30 is:

$$R = r_1 + r_2' + r_3' + r_4' + r_5'$$

where $$r_2' = (1 - r_1) \times r_2$$
$$= (1 - 0.021) \times 6.5 \times 10^{-4}$$
$$= 6.4 \times 10^{-4},$$
$$r_3' = (1 - r_1 - r_2') \times r_3$$
$$= (1 - 0.021 - 6.4 \times 10^{-4}) \times 1.2 \times 10^{-3}$$
$$= 1.2 \times 10^{-3},$$
$$r_4' = (1 - r_1 - r_2' - r_3') \times r_4$$
$$= (1 - 0.021 - 6.4 \times 10^{-4} - 1.2 \times 10^{-3}) \times 1.2 \times 10^{-3}$$
$$= 1.2 \times 10^{-3}$$

and $$r_5' = (1 - r_1 - r_2' - r_3' - r_4') \times r_5$$
$$= (1 - 0.021 - 6.4 \times 10^{-4} - 1.2 \times 10^{-3} - 1.2 \times 10^{-3}) \times 1.2 \times 10^{-3}$$
$$= 1.2 \times 10^{-3}.$$

Consequently, the total reflectance R is:

$$R = 0.021 + 6.4 \times 10^{-4} + 1.2 \times 10^{-3} + 1.2 \times 10^{-3} + 1.2 \times 10^{-3}$$
$$= 0.025,$$

and it will now be understood that the reflectance in this case may also be reduced, as in the case of FIG. 6, to about one-half in comparison with the case shown in FIG. 6.

The total reflectance R will now be evaluated for the cases in which other materials are used for the heat absorbing layer 31. In these cases, only the values of the reflectance $r_3$ at the interface between the transparent silicone adhesive layer 51 and the heat absorbing layer 31, and the reflectance $r_4$ at the interface between the heat absorbing layer 31 and the transparent silicone resin layer 50 are different from those of the above-mentioned case (I). Thus, the total reflectance for each case may be obtained by evaluating these values for various materials constituting each heat absorbing layer 31 and substituting thereof into the corresponding equations of calculation described above.

(II) If the heat absorbing layer 31 is formed of polycarbonate, since the refractive index of polycarbonate $n_4 = 1.59$, the values of reflectance $r_3$ and $r_4$ may be evaluated in the same manner as the above-mentioned case (I):

$$r_3 = (n_3 - n_4)^2/(n_3 + n_4)^2$$
$$= 3.6 \times 10^{-3}$$
and
$$r_4 = (n_4 - n_5)^2/(n_4 + n_5)^2$$
$$= 3.6 \times 10^{-3}.$$
Thus,
$$r_3' = (1 - r_1 - r_2') \times r_3$$
$$= 3.5 \times 10^{-3}$$
and
$$r_4' = (1 - r_1 - r_2' - r_3') \times r_4$$
$$= 3.5 \times 10^{-3}.$$
Consequently,
$$R = r_1 + r_2' + r_3' + r_4' + r_5'$$
$$= 0.030.$$

(III) If the heat absorbing layer 31 is formed of vinyl chloride, since the refractive index of vinyl chloride $n_4 = 1.54$, $$r_3 = (n_3 - n_4)^2/(n_3 + n_4)^2$$
$$= 1.9 \times 10^{-3}$$
and
$$r_4 = (n_4 - n_5)^2/(n_4 + n_5)^2$$
$$= 1.9 \times 10^{-3}.$$
Thus,
$$r_3' = (1 - r_1 - r_2') \times r_3$$
$$= 1.9 \times 10^{-3}$$
and
$$r_4' = (1 - r_1 - r_2' - r_3') \times r_4$$
$$= 1.9 \times 10^{-3}.$$
Consequently,
$$R = r_1 + r_2' + r_3' + r_4' + r_5'$$
$$= 0.025.$$

(IV) If the heat absorbing layer 31 is formed of acrylic resin, since the refractive index of acrylic resin $n_4 = 1.49$, $$r_3 = (n_3 - n_4)^2/(n_3 + n_4)^2$$
$$= 7.6 \times 10^{-4}$$
and
$$r_4 = (n_4 - n_5)^2/(n_4 + n_5)^2$$
$$= 7.6 \times 10^{-4}.$$
Thus,
$$r_3' = (1 - r_1 - r_2') \times r_3$$
$$= 7.4 \times 10^{-4}$$
and
$$r_4' = (1 - r_1 - r_2' - r_3') \times r_4$$
$$= 7.4 \times 10^{-4}.$$
Consequently,
$$R = r_1 + r_2' + r_3' + r_4' + r_5'$$
$$= 0.024.$$

Accordingly, the total reflectance for each case may be reduced to about one-half in comparison with the case shown in FIG. 2 so that the reflection of sunlight may be suppressed whereby sunlight may be effectively utilized.

Although the embodiments shown in FIGS. 6 and 7 have been described with the film 41 and the transparent boron containing resin film 52 being attached by the use of adhesives, it is to be understood that they may also be provided by coating or vapor deposition as has been described for the case of the heat absorbing layer 31 in FIG. 5 or by the use of metallic mountings.

Furthermore, although the embodiments have been described wherein the superstrate for the a-Si solar cell is made of glass, it is to be noted that metallic materials such as Al or stainless which make ohmic contact with the a-Si layer may also be used as a substrate.

Figure 8:
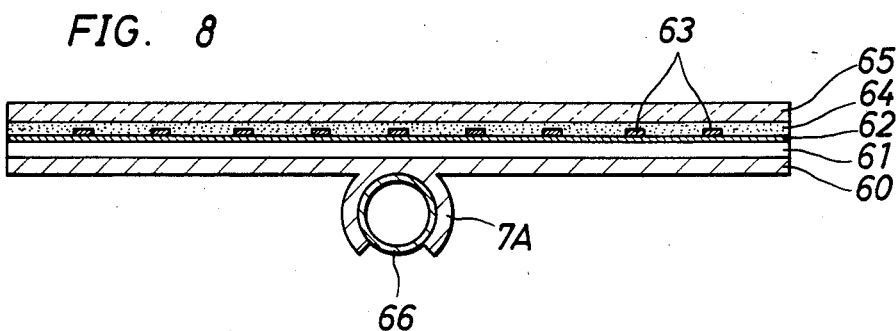

Such an example is shown in FIG. 8. In this embodiment, an a-Si layer 61, an ITO (Indium Tin Oxide) layer 62 as a transparent electrode, and a comb shaped electrode (base electrode) 63 are successively formed on a heat collecting plate 60 which is formed by Al which may also be usable as the lower electrode, whereby the solar cell is formed. Here, the comb shaped electrode 63 may be formed by vapor depositing Al or the like to compensate for the inferior electric conductivity of the ITO layer 62. By attaching a thermal ray absorbing glass 65 onto the thus formed solar cells through a transparent adhesive 64, a hybrid collector may be constructed. Reference character 66 denotes a heat medium tube.

Figure 9:
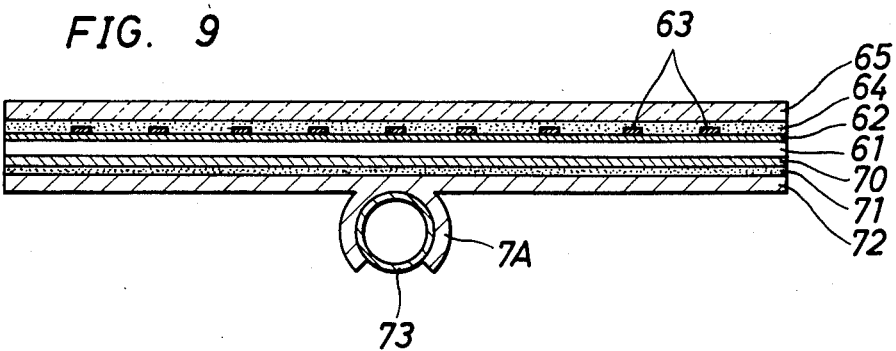

FIG. 9 shows still another embodiment in which the lower electrode and the heat collecting plate are separately formed. Solar cells may be formed in the same manner as shown in FIG. 8 by successively forming an a-Si layer 61, an ITO layer 62, and a comb shaped electrode 63 on a stainless substrate 70 for a lower electrode. A thermal ray absorbing glass 65 may further be attached on the top surface of the above-mentioned structure through a transparent adhesive 64. The thus formed structure may be secured on a heat collecting plate 72 through an insulating adhesive 71 to form a hybrid collector. Reference character 73 denotes a heat medium tube.

It should further be understood that, in the embodiments shown in FIGS. 8 and 9, an ordinary glass plate and a heat absorbing layer may be provided as has been described with reference to FIG. 5 or reflection preventing films may be provided as has been described with reference to FIGS. 6 and 7, instead of the thermal ray absorbing glass 65.

While the invention has been described in its preferred embodiments, it is to be understood that modifications will be apparent to those skilled in the art without departing from the spirit of the invention.

The scope of the invention, therefore, is to be determined solely by the following claims.

What is claimed is:

1. A sunlight conversion apparatus for converting solar energy to electrical and thermal energy, comprising:
   at least one solar cell having an amorphous silicon layer;
   a superstrate, said amorphous silicon layer being integrally joined to said superstrate;
   a heat collecting plate attached to said at least one solar cell, at a surface thereof opposite said superstrate;
   a metallic electrode formed on said amorphous silicon layer on a side thereof facing said heat collecting plate; and
   a container enclosing said solar cell superstrate, heat collecting plate, and metallic electrode;
   wherein said superstrate is comprised of a light permeable, heat absorbing material that is transparent to solar energy of a range of wavelengths that is substantially absorbed by said amorphous silicon layer, and substantially absorbs solar energy of a range of wavelengths that is substantially not absorbed by said amorphous silicon layer, said superstrate converting said energy it absorbs into thermal energy.

2. A sunlight-into-energy conversion apparatus according to claim 1, wherein the light-permeable heat absorbing material is phosphate glass or borophosphate glass.

3. A sunlight-into-energy conversion apparatus according to claim 1, wherein the light-permeable heat absorbing material is synthetic resin containing a heat absorbing material.

4. A sunlight conversion apparatus for converting solar energy to electrical and thermal energy, comprising:
   at least one solar cell having an amorphous silicon layer;
   a superstrate, said amorphous silicon layer being integrally joined to said superstrate;
   a heat absorbing layer provided on a surface of said superstrate on the side of incidence of sunlight;
   a heat collecting plate attached to said at least one solar cell, at a surface thereof opposite to said substrate; and
   a metallic electrode formed on said amorphous silicon layer on a side thereof at said heat collecting plate;
   wherein said superstrate is comprised of a light permeable material that is transparent to solar energy of a range of wavelengths that is not substantially absorbed by said amorphous silicon layer, and said heat absorbing layer substantially absorbs solar energy of a range of wavelengths that is substantially not absorbed by said amorphous silicon layer, said heat absorbing layer converting said energy it absorbs into thermal energy.

5. A sunlight-into-energy conversion apparatus according to claim 1, wherein the light-permeable material is glass or synthetic resin transmitting the full wavelength range of sunlight, and the heat absorbing layer is comprised of heat absorbing material selected from the group consisting of transparent organic resin, phosphate glass, and borophosphate glass.

6. A sunlight-into-energy conversion apparatus according to claim 5, wherein said transparent organic resin is selected from the group consisting of polycarbonate, vinyl chloride, and acrylic.

7. A sunlight-into-energy conversion apparatus for converting incident sunlight into electricity and heat, and outputting them, comprising a main portion including at least one solar cell comprising at least one amorphous silicon layer formed on a substrate, and including a heat collecting plate attached thereto so as to form a monolithic structure enclosed in a vessel, characterized in that the substrate is made of a metallic material while a transparent electrode having a heat absorbing layer attached thereon is provided adjacent to the amorphous silicon layer on the side of incidence of sunlight.

8. A sunlight-into-energy conversion apparatus according to claim 7, wherein said substrate made of a metallic material is used as both a lower electrode and a heat collecting plate.

9. A sunlight-into-energy conversion apparatus according to claim 7, wherein said substrate made of a metallic material is secured to said heat collecting plate through insulating adhesive.

10. A sunlight-into-energy conversion apparatus according to claim 7, wherein a comb shaped metallic electrode is provided together with the transparent electrode.

* * * * *